United States Patent
Fitzi et al.

(10) Patent No.: US 12,015,395 B2
(45) Date of Patent: Jun. 18, 2024

(54) CHARGE SENSITIVE AMPLIFIER CIRCUIT FOR SENSOR FRONTEND

(71) Applicant: ams International AG, Jona (CH)

(72) Inventors: Andreas Fitzi, Stäfa (CH); Roger Ehrensperger, Schaenis (CH)

(73) Assignee: AMS INTERNATIONAL AG, Jona (CH)

( * ) Notice: Subject to any disclaimer, the term of this patent is extended or adjusted under 35 U.S.C. 154(b) by 156 days.

(21) Appl. No.: 17/783,726

(22) PCT Filed: Nov. 12, 2020

(86) PCT No.: PCT/EP2020/081917
§ 371 (c)(1),
(2) Date: Jun. 9, 2022

(87) PCT Pub. No.: WO2021/115720
PCT Pub. Date: Jun. 17, 2021

(65) Prior Publication Data
US 2023/0006665 A1  Jan. 5, 2023

(30) Foreign Application Priority Data

Dec. 13, 2019  (EP) .................................... 19216114

(51) Int. Cl.
*H03K 17/12*  (2006.01)
*H03K 17/955*  (2006.01)

(52) U.S. Cl.
CPC ......... *H03K 17/122* (2013.01); *H03K 17/955* (2013.01); *H03K 2217/0054* (2013.01);
(Continued)

(58) Field of Classification Search
CPC ............... H03K 17/122; H03K 17/955; H03K 2217/0054; H03K 2217/960725;
(Continued)

(56) References Cited

U.S. PATENT DOCUMENTS

| 4,454,423 A * | 6/1984 | Koob ...................... G01T 1/185 |
| | | 250/374 |
| 5,488,415 A | 1/1996 | Uno |
| 7,977,647 B2 * | 7/2011 | Seino ........................ G01T 1/24 |
| | | 250/336.1 |

(Continued)

FOREIGN PATENT DOCUMENTS

| JP | H03256408 A | 11/1991 |
| JP | H07-203319 A | 8/1995 |

(Continued)

OTHER PUBLICATIONS

O'Reilly, Siobhan (EP Authorized Officer), International Search Report and Written Opinion in corresponding International Application No. PCT/EP2020/081917 mailed on Jan. 15, 2021, 13 pages.

(Continued)

*Primary Examiner* — Christopher P McAndrew
(74) *Attorney, Agent, or Firm* — MH2 TECHNOLOGY LAW GROUP LLP

(57) ABSTRACT

A charge sensitive amplifier circuit for sensor frontend comprises an input node to be connected to a sensor to receive an input charge, and an output node to be connected to a charge conversion circuit. The charge sensitive amplifier circuit comprises a first transfer switch located between the input node and the output node to transfer the input charge to the output node. The charge sensitive amplifier circuit further comprises a second transfer switch located in parallel to the first transfer switch between the input node and the output node to transfer the input charge to the output node.

16 Claims, 1 Drawing Sheet

(52) U.S. Cl.
CPC ............ *H03K 2217/960725* (2013.01); *H03K 2217/96073* (2013.01)

(58) Field of Classification Search
CPC ....... H03K 2217/96073; H03K 17/941; H03K 2217/94116; H03K 2217/960705; H04N 25/77
USPC ........................................................ 324/658
See application file for complete search history.

(56) References Cited

U.S. PATENT DOCUMENTS

| | | | |
|---|---|---|---|
| 10,386,874 B2* | 8/2019 | Satoh | ................. H01L 27/1057 |
| 2009/0194701 A1* | 8/2009 | Seino | .......................... G01T 1/24 |
| | | | 250/370.13 |
| 2010/0283485 A1 | 11/2010 | Valisuo et al. | |
| 2012/0305786 A1 | 12/2012 | Dierickx | |
| 2016/0370226 A1 | 12/2016 | Lund | |

FOREIGN PATENT DOCUMENTS

| | | |
|---|---|---|
| JP | H11-224496 A | 8/1999 |
| JP | 2005043264 A | 2/2005 |
| JP | 2008294807 A | 12/2008 |
| JP | 2010533288 A | 10/2010 |
| KR | 20120019178 A | 3/2012 |
| WO | 2014175110 A1 | 10/2014 |

OTHER PUBLICATIONS

European Extended Search Report in corresponding European Application No. 19216114.9 mailed on Jun. 18, 2020, 10 pages.
Notice of Reason for Rejection issued in corresponding Japanese Patent Application No. 2022-534755 dated Oct. 17, 2023.
Office Action issued in corresponding Korean Patent Application No. 10-2022-7023667 dated Nov. 10, 2023, with English language translation, 12 pages.

* cited by examiner

CHARGE SENSITIVE AMPLIFIER CIRCUIT FOR SENSOR FRONTEND

CROSS-REFERENCE TO RELATED APPLICATIONS

The present application is the national stage entry of International Patent Application No. PCT/EP2020/081917, filed on Nov. 12, 2020, and published as WO 2021/115720 A1 on Jun. 17, 2021, which claims the benefit of priority of European Patent Application No. 19216114.9 filed on Dec. 13, 2019, all of which are incorporated by reference herein in their entireties.

TECHNICAL FIELD

The disclosure relates to a charge sensitive amplifier circuit for a sensor frontend, for example a sensor frontend of an optical sensor to transfer a charge generated by a photosensitive cell of the optical sensor to a charge-to-voltage conversion stage.

BACKGROUND

In line sensors with a large number of pixels and serial read-out, photosensitive cells, for example photodiodes, are successively connected to a line to read out a charge generated in a respective photosensitive cell by the incidence of light. The charge generated from a photodiode during exposure time is applied via the line to a charge sensitive amplifier to transfer the charge to a conversion stage, for example a charge-to-voltage conversion stage. The transfer of the charge has to be done in a defined transfer time (readout time) before the next pixel/photosensitive cell is connected via the line to an input node of the charge sensitive amplifier for transferring the charge generated in the photosensitive cell to the charge conversion stage.

A line sensor input stage including the charge sensitive amplifier requires high settling accuracy during short transfer times, which demands for a wide average bandwidth of the input stage and the charge sensitive amplifier. On the other hand, the noise of the input stage is optimized by a low bandwidth at the end of an integration phase in which the read-out charge is integrated. Moreover, charge sensitive amplifiers for sensor frontends require a high dynamic range. This requirement is also in contrast to the requirement that the noise of the input stage is optimized with a bandwidth of the charge sensitive amplifier that is as low as possible.

The charge sensitive amplifier might comprise a single transistor switch to transfer the input charge generated from a photodiode/photosensitive cell to the charge conversion stage. The single transistor switch might be controlled in such a way that the bandwidth is large at the beginning of the integration and is reduced at the end of the charge transfer. This can be done by using a high ohmic and a low ohmic phase for the switch during the charge transfer. It can also be done dynamically. Depending on the charge at the input, the transfer time is longer or shorter in the low ohmic phase, and the transistor switch gets more and more high ohmic during the charge removal.

In line sensors, each input stage is connected to a line of pixels where some pixels might be defect and others are not defect. If large charges are not removed by the charge sensitive amplifier of the input stage, the charges will appear on the following pixels as an image artifact. Input charge can vary over several decades, as not only the charge of the signal has to be removed by the charge sensitive amplifier of the input stage, but also excessive charges from defect pixels have to be removed.

Due to the high dynamic range of the input charge applied at an input node of a charge sensitive amplifier of an input stage, a single transistor switch included in the charge sensitive amplifier to transfer the charge generated from a photodiode to the charge conversion stage is not the optimum solution as too much bandwidth is required to remove all the charge during the transfer phase and still fulfill the low noise requirements at the end of the charge transfer.

There is a desire to provide a charge sensitive amplifier circuit for a sensor frontend which allows the noise of the sensor frontend to be optimized without limiting the charge input range.

SUMMARY

A charge sensitive amplifier circuit for a sensor frontend having a high dynamic input charge range for a defined conversion time without compromising the noise of the input stage is specified in claim 1.

According to an embodiment of a charge sensitive amplifier circuit for sensor frontend, the charge sensitive amplifier circuit comprises an input node to be connected to a sensor to receive an input charge, and an output node to be connected to a charge conversion circuit. The charge sensitive amplifier circuit further comprises a first transfer switch located between the input node and the output node to transfer the input charge to the output node, and a second transfer switch located in parallel to the first transfer switch between the input node and the output node to transfer the input charge to the output node.

Instead of using a single transfer switch/transfer gate a first transfer switch/transfer gate and at least a second transfer switch/transfer gate are implemented in the charge sensitive amplifier circuit. Both transistor switches have a dynamic control to lower the bandwidth at the end of the charge integration.

The first transfer switch is controlled in such a way that the bandwidth is large at the beginning of the integration and is reduced by turning the first transfer switch nearly off, i.e. by operating the first transfer switch with a low conductivity, at the end of the charge transfer. The first transfer switch is advantageously not turned off completely, i.e. not operated in a completely non-conductive state, at the end of the charge transfer.

According to a possible embodiment of the charge sensitive amplifier circuit, during the transfer of small charges only the first transfer switch is turned on, i.e. operated in a high-conductive state, whereas during the transfer of large charges both of the first and second transfer switches are turned on at the beginning of the integration/charge transfer time, but only the first transfer switch finishes the charge output to the output node. The second transfer switch only turns on, if large input charges have to be removed at the start of the integration/beginning of the charge transfer time.

According to another possible embodiment, the second transfer switch turns off before the first transfer switch is nearly turned off at the end of the charge transfer/end phase of the charge transfer time. As the first transfer switch turns off last, the bandwidth limitation at the end of the integration is still driven by the first transfer switch which does not require high bandwidth.

Therefore, the proposed configuration of the charge sensitive amplifier circuit makes it possible to lower the noise without reducing the input charge range. The proposed charge sensitive amplifier circuit has a variable bandwidth and can overcome the contradistinction of the need for a wide average bandwidth to require high settling accuracy of the input stage and, on the other hand, requiring a low bandwidth to reduce the noise of the input stage. The proposed circuit configuration is suited for integrated circuits.

Additional features and advantages are set forth in the detailed description that follows. It is to be understood that both the foregoing general description and the following detailed description are merely exemplary, and are intended to provide an overview or framework for understanding the nature and character of the claims.

BRIEF DESCRIPTION OF THE DRAWINGS

The accompanying drawings are included to provide further understanding, and are incorporated in, and constitute a part of, the specification. As such, the disclosure will be more fully understood from the following detailed description, taken in conjunction with the accompanying figures in which.

DETAILED DESCRIPTION

Figure 1:
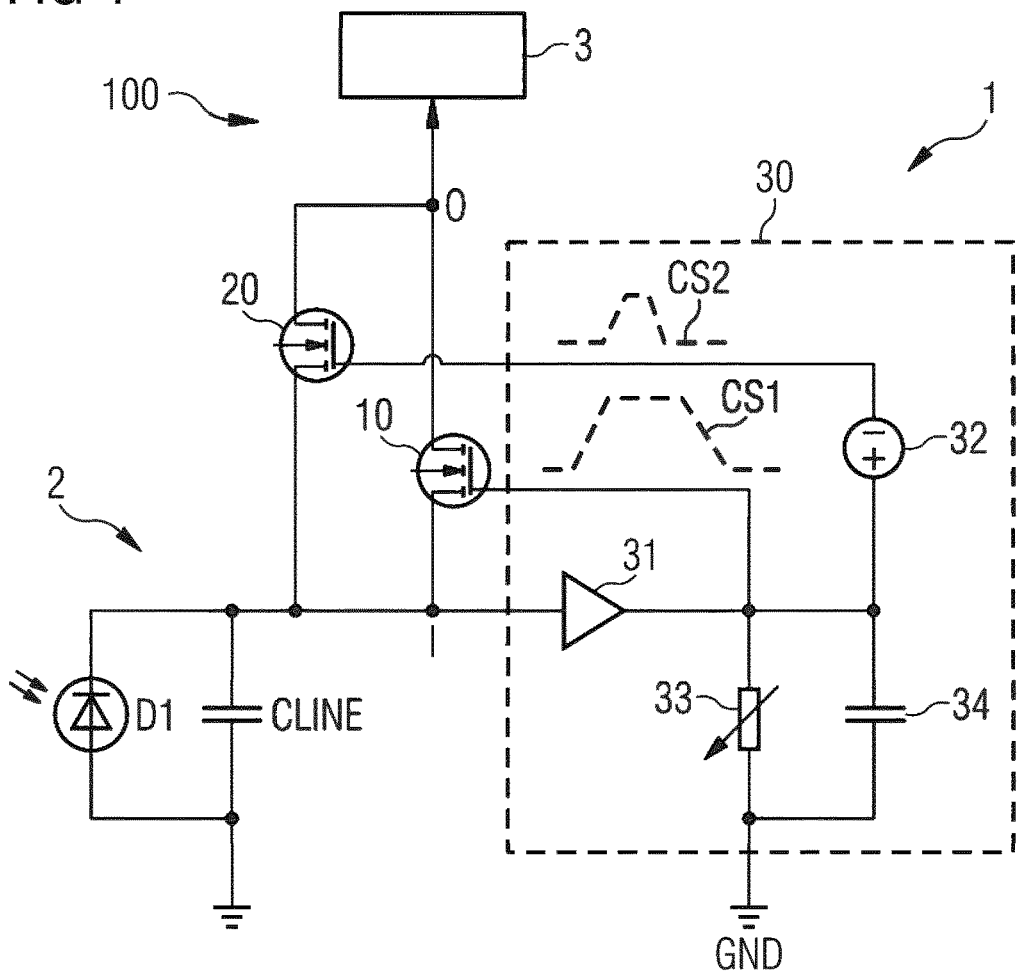
FIG. 1 shows an embodiment of an image sensor circuitry comprising a charge sensitive amplifier circuit for a sensor frontend having a high dynamic input charge range while lowering the noise of the circuit.

FIG. 1 shows an embodiment of an image sensor circuitry 100 comprising a charge sensitive amplifier circuit 1 for a sensor frontend, a sensor 2 and a charge conversion circuit 3. The charge conversion circuit 3 may be embodied as a charge-to-voltage conversion circuit, a charge-to-current conversion circuit, a charge-to-digital conversion circuit, etc.

The charge sensitive amplifier circuit 1 comprises an input node I to be connected to the sensor 2 to receive an input charge from the sensor 2, and an output node O to be connected to the charge conversion circuit 3. The charge sensitive amplifier circuit 1 further comprises a first transfer switch 10 located between the input node I and the output node O to transfer the input charge received from the sensor 2 to the output node O. Moreover, the charge sensitive amplifier circuit 1 comprises at least a second transfer switch 2 located in parallel to the first transfer switch 10 between the input node I and the output node O to transfer the input charge to the output node O. The input node I of the charge sensitive amplifier circuit 1 is connected to the sensor 2, and the output node O of the charge sensitive amplifier circuit 1 is connected to the charge conversion circuit 2.

The sensor 2 may be configured as an optical sensor comprising a plurality of photosensitive cells D1 which may be configured as photodiodes. Each photosensitive cell D1 may be connected to a line by means of a respective controllable switch to read out a charge generated from the respective photodiode during an exposure time. The line to which the photosensitive cells are to be connected for reading out their charge is represented in FIG. 1 by a line capacitance CLINE. The optical sensor 2 may be controlled such that the photosensitive cells D1 are read out sequentially, and the respective charge of the photosensitive cells D1 is applied to the input node I of the charge sensitive amplifier circuit 1 to be transferred by the charge sensitive amplifier circuit 1 to the charge conversion circuit 3.

According to another possible embodiment, the sensor 3 may be configured as a capacitive sensor comprising a plurality of capacitive sensor cells. The capacitive sensor is controlled such that the capacitive cells are read out sequentially and a respective charge of the capacitive cells is applied to the input node I of the charge sensitive amplifier circuit 10 to be transferred to the charge conversion circuit 3.

According to the embodiment of the charge sensitive amplifier circuit 1, the input charge received by the charge sensitive amplifier circuit 1 at the input node I is transferred by the transfer switches 10 and 20 to the output node O and thus to the charge conversion circuit 3. The first and second transfer switch 10 and 20 are controlled such that the charge transfer of the charge generated from one of the photodiodes D1 and applied to the input node I is done in a defined transfer time/line time before the next pixel/photosensitive cell is connected via the line to the input node I of the charge sensitive amplifier circuit 1.

The charge sensitive amplifier circuit 1 comprises a control circuit 30 to generate a respective control signal CS1, CS2 to control a respective conductivity of the first and second transfer switch 10 and 20. The control circuit 30 is configured to generate the control signal CS1 for controlling the first transfer switch 10 during a transfer time of the first transfer switch, and the control signal CS2 for controlling the second transfer switch 20 during a transfer time of the second transfer switch to transfer the input charge from the input node I to the output node O over the transfer switches 10 and 20.

The control circuit 30 is configured to generate the control signal CS1 for controlling the first transfer switch 10 and the control signal CS2 for controlling the second transfer switch 20 such that the respective first and second transfer switch 10 and 20 are operated in a time dependent operation state during the respective transfer time of the first and second transfer switch 10 and 20.

According to a possible embodiment of the charge sensitive amplifier circuit, the control circuit 30 is configured to generate the respective control signal CS1, CS2 for controlling the first and second transfer switch 10 and 20 such that the respective conductivity of the first and second transfer switch 10, 20 is higher at the beginning of the respective transfer time of the first and second transfer switch 10, 20 than in the end phase of the respective transfer time of the first and second transfer switch 10, 20.

According to a possible embodiment of the charge sensitive amplifier circuit, the control circuit 30 is configured to generate the respective control signal CS1, CS2 for controlling the first and second transfer switch 10, 20 such that the respective conductivity of the first and second transfer switch 10, 20 is continuously reduced from the beginning of the respective transfer time of the first and second transfer switch 10, 20 until the end phase of the respective transfer time of the first and second transfer switch 10, 20.

According to an embodiment of the charge sensitive amplifier circuit 1, at the beginning of the respective transfer time of the first and second transfer switch 10, 20, although both transfer switches are operated in a conductive/turned-on state, the conductivity of the second transistor 20 is higher than the conductivity of the first transistor 10. This is achieved by the first transfer switch 10 being configured as a high ohmic switch and the second transfer switch 20 being configured as a low ohmic switch. The first transfer switch shows a lower conductivity at the beginning of the transfer time than the second transfer switch.

According to a possible embodiment of the charge sensitive amplifier circuit 1, at the end of the respective transfer time of the first and second transfer switch 10, 20, the conductivity of the second transfer switch 20 is lower than the conductivity of the first transfer switch 10. In particular, the second transfer switch 20 is completely turned off, i.e. operated in a non-conductive state, in the end phase of the transfer time of the second transfer switch, and the first transfer switch 10 is nearly turned off, i.e. operated still in a low-conductive state, in the end phase of the transfer time of the first transfer switch. This configuration ensures that the first transfer switch 10 will never turn off completely, especially in the end phase of the transfer time of the first transfer switch, to prevent the input node I from becoming negative and blocking the charge conversion of the next pixel.

According to an embodiment of the charge sensitive amplifier circuit 1, the first and second transfer switches 10 and 20 are configured such that the respective conductivity of the first and second transfer switch 10, 20 is dependent on whether a level of the respective control signal CS1, CS2 is above or below a respective threshold voltage of the first and second transfer switch 10 and 20.

The first and second transfer switch 10 and 20 may have the same threshold voltage. In this case, the control circuit 30 may be configured to generate the control signal CS1 for controlling the first transfer switch 10 with another level than the control signal CS2 for controlling the second transfer switch 20. In particular, the control circuit 30 generates the respective level of the first and second control signal CS1, CS2 such that, in the end phase of the respective transfer time of the first and second transfer switch 10 and 20, the conductivity of the first transfer switch 10 is higher than the conductivity of the second transfer switch 20 to ensure that the first transfer switch 10 will not turn off completely at the end of the transfer time.

Figure 2:
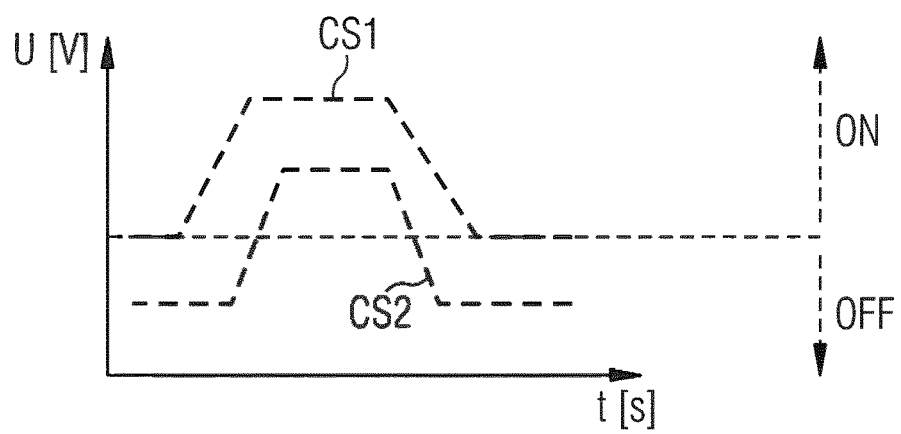
FIG. 2 shows respective control signals to control a first and second transfer switch of a charge sensitive amplifier circuit.

FIG. 2 shows a possibility for generating the control signal CS1 by the control circuit 30 for controlling the conductivity of the first transfer switch 10, and for generating the control signal CS2 by the control circuit 30 for controlling the conductivity of the second transfer switch 20 during the transfer time, assuming that the first and second transfer switch 10 and 20 have the same threshold voltage.

As illustrated in FIG. 2, the control circuit 30 generates the respective control signal CS1 and CS2 for controlling the first and second transfer switch 10 and 20 such that a minimum and maximum level of the control signal CS1 for controlling the first transfer switch 10 generated during the transfer time of the first transfer switch is higher than a minimum and maximum level of the control signal CS2 for controlling the second transfer switch 20.

FIG. 2 shows the course of the control signal CS1 being generated with a level above the course of the control signal CS2 during the respective transfer time of the first and second transfer switch. The threshold level of the first and second transfer switch is indicated in FIG. 2 by the dashed horizontal line. Regarding the embodiment shown in FIG. 2, the first and second transfer switch have the same threshold voltage.

The first and second transfer switch 10 and 20 are turned on, i.e. are operated in a conductive state, when the respective control signal CS1 and CS2 has its maximum level. On the other hand, the first transfer switch 10 is operated in a low-conductive state, and the second transfer switch 20 is operated in state of lower conductivity than the first transfer switch or a non-conductive state/turned-off state, when the respective control signal CS1 and CS2 has its respective minimum level.

As illustrated in FIG. 2, the minimum level of the control signal CS2 is below the minimum level of the control signal CS1. The minimum level of the control signal CS1 is equal to the threshold voltage of the first transfer switch 10 which enables the first transfer switch 10 to be operated in a low-conductive state in the end phase of the transfer time of the first transfer switch. However, since the control signal CS1 is generated by the control circuit 30 with a level not below the threshold voltage of the first transfer switch 10, it is ensured that the first transfer switch 10 is not completely turned off at the end of the transfer time. This allows preventing the input node I of the charge sensitive amplifier circuit from becoming negative and blocking the charge conversion of the next pixel.

As explained above, the first and second transfer switch 10, 20 are configured such that the conductivity of the second transfer switch 20 is higher than the conductivity of the first transfer switch 10, even if the maximum of the control signal CS2 for controlling the second transfer switch 20 at the beginning of the transfer time of the second transfer switch 20 is below the maximum level of the control signal CS1 for controlling the first transfer switch 10 at the beginning of the transfer time of the first transfer switch 10.

In order to provide the first transfer switch 10 at the beginning of the transfer time with the lower conductivity than the second transfer switch 20, i.e. as a high ohmic transfer switch, and the second transfer switch 20 with a higher conductivity than the first transfer switch 10, i.e. as a low ohmic transfer switch, the geometries, particularly the relationship of length and width of the respective conductive channel of the transfer switch 10 and 20, have to be selected in an appropriate way.

According to another possible embodiment of the charge sensitive amplifier circuit 1, the control circuit 30 is configured to generate the control signal CS1 for controlling the conductivity of the first transfer switch 10 with the same level as the control signal CS2 for controlling the conductivity of the second transfer switch 20. In this case, it has to be ensured that the threshold voltage of the first transfer switch 10 is different from the threshold voltage of the second transfer switch 20 to provide the second transfer switch 20 with a conductivity higher than the conductivity of the first transfer switch 10, i.e. to provide the transfer switch 10 as a high ohmic switch and to provide the transfer switch 20 as a low ohmic switch.

According to another possible embodiment, the first and second transfer switch 10 and 20 may be implemented such that a first bulk bias voltage applied to the first transfer switch 10 is different from a second bulk bias voltage applied to the second transfer switch 20. In this case, the control circuit 30 may also be configured to generate the control signal CS1 for controlling the first transfer switch 10 with the same level as the control signal CS2 for controlling the second transfer switch 20, but it is nevertheless ensured that the conductivity of the second transfer switch 20 is greater than the conductivity of the first transfer switch 10 at the beginning of the respective transfer time of the first and second transfer switch 10 and 20.

As shown in FIG. 2, the control circuit 30 is configured to generate the respective control signal CS1, CS2 for controlling the first and second transfer switch 10 and 20 such that the end phase of the transfer time of the second transfer switch 20 ends before the end phase of the transfer time of the first transfer switch 10.

According to a possible embodiment of the charge sensitive amplifier circuit 1, the control circuit 30 may comprise at least one amplifier 31 having an input side being coupled to the input node I of the charge sensitive amplifier circuit, and an output side to generate the control signal CS1 for controlling the first transfer switch 10 and/or the control signal CS2 for controlling the second transfer switch 20 in response to the level of the input charge. The at least one amplifier 31 may be configured as an operational transconductance amplifier.

As shown for the embodiment of the charge sensitive amplifier circuit 1 in FIG. 1, the control signal CS1 generated by the amplifier 31 can be directly applied to a control node of the first transfer switch 10. That means the control signal CS1 is the output signal of the amplifier 31. According to the embodiment of the charge sensitive amplifier circuit 1 shown in FIG. 1, the control signal CS2 is derived from the output signal of the amplifier 31. As shown in FIG. 1, a level shifter 32 is connected between the output of the amplifier 31 and the control node of the second transfer switch 20.

The level shifter 32 enables the second transfer switch 20 to be controlled by the control signal CS2 being a level-shifted copy of the control signal CS1 applied to the first transfer switch 10. In order to provide the control signal CS2 with a course below the course of the control signal CS1, the level shifter 32 shifts the course of the control signal CS1 generated at the output of the amplifier 31 downwards so that the course of the control signal CS2 is below the course of the control signal CS1, as illustrated in FIG. 2.

According to a possible embodiment of the charge sensitive amplifier circuit 1, the control circuit 30 may be configured to adjust the gain of the amplifier 31 such that the gain of the amplifier 31 is higher in the first phase of the respective transfer time of the first and second transfer switch 10 and 20 than in the second phase of the respective transfer time of the first and second transfer switch 10 and 20. In this case, it can be ensured that the gain of the amplifier 31 is high at the start of the integration, and then reduced dynamically.

In order to reduce the gain of the amplifier 31, according to a possible embodiment of the charge sensitive amplifier circuit 1, the control circuit 30 comprises a resistor 33 having a variable resistance. As shown in FIG. 1, the resistor 33 is connected to the output side of the amplifier 31 and to a reference/ground potential GND. The reference sign 34 represents a load capacitor connected between the output side of the amplifier 31 and the reference/ground potential.

The functioning of the charge sensitive amplifier circuit 1 is described in the following.

At the start of the charge integration, the control circuit 30 generates the control signal CS1 for controlling the first transfer switch 10 and the control signal CS2 for controlling the second transfer switch 20 such that the first transfer switch 10 is starting to transfer the input charge first from the input node I to the output node O.

If the input charge is high, the control circuit 30 enables, by the amplifier 31, that the control signal CS1 for controlling the first transfer switch 10 is rising to its maximum level, and the control signal CS2 for controlling the second transfer switch 20 is generated such that the second transfer switch 20 starts to transfer charge in parallel from the input node I to the output node O.

If most of the charge is transferred from the input node I to the output node O, the level of the output signal of the amplifier 31 drops which causes that the level of the control signal CS1, for example a control voltage, applied at the control node of the first transfer switch 10 also drops. The control signal CS2 derived from the output signal of the amplifier 31 and thus from the control signal CS1 is generated by the level shifter 32 such that the second transfer switch 20 turns off completely, i.e. the second transfer switch 20 is operated in a non-conductive state. The small remaining part of the charge at the end of the transfer time is only transferred over the first transfer switch 10.

Optimizing the first transfer switch 10 for a high dynamic range of input charge is hard to achieve under the aspect that the first transfer switch 10 has to be high ohmic at the end of the integration due to noise requirements and shall never generate negative charge at the input node I by turning off completely, especially if the excess charge caused from a defect pixel has to be removed from the input node I of the charge sensitive amplifier circuit in a short transfer time. Adding the second transfer switch 20 parallel to the first transfer switch 10 allows to shorten the required time to remove large charges without compromising noise performance.

The proposed concept of the charge sensitive amplifier circuit 10 can be extended to a higher number of transfer switches/gates and level shifters, for example using four transfer switches/gates with three level shifters to improve the dynamic range or speed of the charge transfer. According to a possible embodiment, the control circuit 30 may comprise more than two transfer switches with different threshold or bulk voltages or different geometries.

Furthermore, according to another possible embodiment of the charge sensitive amplifier circuit 10, in addition to the amplifier 31, a second amplifier may be provided in the control circuit 30 which controls the second transfer switch 20 to get the same benefits as explained above.

The invention claimed is:

1. A charge sensitive amplifier circuit for sensor frontend, comprising:
    an input node to be connected to a sensor to receive an input charge;
    an output node to be connected to a charge conversion circuit;
    a first transfer switch located between the input node and the output node to transfer the input charge to the output node;
    a second transfer switch located in parallel to the first transfer switch between the input node and the output node to transfer the input charge to the output node; and
    a control circuit to generate a respective control signal to control a respective conductivity of the first and second transfer switch,
    wherein the control circuit is configured to generate the respective control signal for controlling the first and second transfer switch during a respective transfer time of the first and second transfer switch to transfer the input charge from the input node to the output node,
    wherein the control circuit is configured to generate the respective control signal for the first and second transfer switch such that the respective first and second transfer switch is operated in a time dependent operation state during the respective transfer time of the first and second transfer switch, and
    wherein the control circuit is configured to generate the respective control signal for controlling the first and second transfer switch such that the respective conductivity of the first and second transfer switch is higher at a beginning of the respective transfer time of the first and second transfer switch than in an end phase of the respective transfer time of the first and second transfer switch.

2. The charge sensitive amplifier circuit of claim 1, wherein the control circuit is configured to generate the respective control signal for controlling the first and second transfer switch such that the respective conductivity of the first and second transfer switch is continuously reduced from the beginning of the respective transfer time of the first and second transfer switch until the end phase of the respective transfer time of the first and second transfer switch.

3. The charge sensitive amplifier circuit of claim 1, wherein, at the beginning of the respective transfer time of the first and second transfer switch, the conductivity of a second transistor is higher than the conductivity of a first transistor.

4. The charge sensitive amplifier circuit of claim 1, wherein, at an end of the respective transfer time of the first and second transfer switch, the conductivity of the second transfer switch is lower than the conductivity of the first transfer switch, in particular, the second transfer switch is operated in a non-conductive state and the first transfer switch is operated in a low-conductive state.

5. The charge sensitive amplifier circuit of claim 1, wherein the first and second transfer switch are configured such that the respective conductivity of the first and second transfer switch depends on whether a level of the respective control signal is above or below a respective threshold voltage of the first and second transfer switch.

6. The charge sensitive amplifier circuit of claim 5, wherein the control circuit is configured to generate the control signal for controlling the first transfer switch with another level than the control signal for controlling the second transfer switch, wherein the first and second transfer switch have the same threshold voltage.

7. The charge sensitive amplifier circuit of claim 5, wherein the control circuit is configured to generate the control signal for controlling the first transfer switch with the same level as the control signal for controlling the second transfer switch, wherein the threshold voltage of the first transfer switch is different from the threshold voltage of the second transfer switch, or wherein a first bulk bias voltage applied to the first transfer switch is different from a second bulk bias voltage applied to the second transfer switch.

8. The charge sensitive amplifier circuit of claim 1, wherein the control circuit is configured to generate the respective control signal for controlling the first and second transfer switch such that the end phase of the transfer time of the second transfer switch ends before the end phase of the transfer time of the first transfer switch.

9. The charge sensitive amplifier circuit of claim 1, wherein the control circuit comprises at least one amplifier having an input side being coupled to the input node, and an output side to generate the control signal for controlling the first transfer switch and/or the control signal for controlling the second transfer switch in response to a level of the input charge.

10. The charge sensitive amplifier circuit of claim 1, wherein the control circuit comprises more than two transfer switches with different threshold or bulk voltages or different geometries.

11. The charge sensitive amplifier circuit of claim 9, wherein the control circuit is configured to adjust a gain of the at least one amplifier such that the gain of the at least one amplifier is higher at the beginning of the transfer time than in the end phase of the transfer time.

12. A sensor circuitry, comprising:
a sensor,
a charge conversion circuit, and
a charge sensitive amplifier circuit as claimed in claim 1,
wherein the input node of the charge sensitive amplifier circuit is connected to the sensor and the output node of the charge sensitive amplifier circuit is connected to the charge conversion circuit.

13. The sensor circuitry of claim 12, wherein the sensor is configured as an optical sensor comprising a plurality of photosensitive cells, wherein the optical sensor is controlled such that the plurality of photosensitive cells are read out sequentially and a respective charge of the plurality of photosensitive cells is applied to the input node of the charge sensitive amplifier circuit to be transferred to the charge conversion circuit.

14. The sensor circuitry of claim 12, wherein the sensor is configured as a capacitive sensor comprising a plurality of capacitive sensor cells, wherein the capacitive sensor is controlled such that the plurality of capacitive sensor cells are read out sequentially and a respective charge of the plurality of capacitive sensor cells is applied to the input node of the charge sensitive amplifier circuit to be transferred to the charge conversion circuit.

15. A charge sensitive amplifier circuit for sensor frontend, comprising:
an input node to be connected to a sensor to receive an input charge;
an output node to be connected to a charge conversion circuit;
a first transfer switch located between the input node and the output node to transfer the input charge to the output node;
a second transfer switch located in parallel to the first transfer switch between the input node and the output node to transfer the input charge to the output node; and
a control circuit to generate a respective control signal to control a respective conductivity of the first and second transfer switch,
wherein the control circuit is configured to generate the respective control signal for controlling the first and second transfer switch during a respective transfer time of the first and second transfer switch to transfer the input charge from the input node to the output node,
wherein the control circuit is configured to generate the respective control signal for the first and second transfer switch such that the respective first and second transfer switch is operated in a time dependent operation state during the respective transfer time of the first and second transfer switch,
wherein, at a beginning of the respective transfer time of the first and second transfer switch, the conductivity of the second transfer switch is higher than the conductivity of the first transfer switch, and wherein, at an end of the respective transfer time of the first and second transfer switch, the conductivity of the second transfer switch is lower than the conductivity of the first transfer switch.

16. A charge sensitive amplifier circuit for sensor frontend, comprising:
   an input node to be connected to a sensor to receive an input charge;
   an output node to be connected to a charge conversion circuit;
   a first transfer switch located between the input node and the output node to transfer the input charge to the output node;
   a second transfer switch located in parallel to the first transfer switch between the input node and the output node to transfer the input charge to the output node; and
   a control circuit to generate a respective control signal to control a respective conductivity of the first and second transfer switch,
   wherein the control circuit is configured to generate the respective control signal for controlling the first and second transfer switch during a respective transfer time of the first and second transfer switch to transfer the input charge from the input node to the output node,
   wherein the control circuit is configured to generate the respective control signal for the first and second transfer switch such that the respective first and second transfer switch is operated in a time dependent operation state during the respective transfer time of the first and second transfer switch, and
   wherein the control circuit is configured to generate the respective control signal for controlling the first and second transfer switch such that an end phase of the transfer time of the second transfer switch ends before the end phase of the transfer time of the first transfer switch.

* * * * *